(12) United States Patent
Dubey et al.

(10) Patent No.: US 9,281,030 B2
(45) Date of Patent: Mar. 8, 2016

(54) CONTROLLING TIMING OF NEGATIVE CHARGE INJECTION TO GENERATE RELIABLE NEGATIVE BITLINE VOLTAGE

(71) Applicant: Synopsys, Inc., Mountain View, CA (US)

(72) Inventors: Prashant Dubey, Uttar Pradesh (IN); Vaibhav Verma, Haryana (IN); Gaurav Ahuja, Dehli (IN); Sanjay Kumar Yadav, Uttar Pradesh (IN); Amit Khanuja, New Delhi (IN)

(73) Assignee: Synopsys, Inc., Mountain View, CA (US)

(*) Notice: Subject to any disclaimer, the term of this patent is extended or adjusted under 35 U.S.C. 154(b) by 19 days.

(21) Appl. No.: 14/178,099

(22) Filed: Feb. 11, 2014

(65) Prior Publication Data

US 2015/0170721 A1    Jun. 18, 2015

(30) Foreign Application Priority Data

Dec. 16, 2013   (IN) ............................ 5867/CHE/2013

(51) Int. Cl.
*G11C 7/00*       (2006.01)
*G11C 7/12*       (2006.01)
*G11C 11/419*   (2006.01)
*G11C 7/04*       (2006.01)

(52) U.S. Cl.
CPC ................ *G11C 7/12* (2013.01); *G11C 11/419* (2013.01); *G11C 7/04* (2013.01)

(58) Field of Classification Search
None
See application file for complete search history.

(56) References Cited

U.S. PATENT DOCUMENTS

| 5,808,956 | A  |    | 9/1998  | Maruyama |
|-----------|----|----|---------|----------|
| 6,501,307 | B1 |    | 12/2002 | Yen |
| 7,983,098 | B2 |    | 7/2011  | Passerini et al. |
| 8,837,229 | B1 | *  | 9/2014  | Dubey et al. ............. 365/189.02 |
| 2007/0081379 | A1 |    | 4/2007 | Clinton et al. |
| 2011/0012639 | A1 |    | 1/2011 | Tamura |
| 2011/0128056 | A1 |    | 6/2011 | An |
| 2011/0235420 | A1 |    | 9/2011 | Sharon et al. |
| 2012/0268983 | A1 |    | 10/2012 | Muralimanohar et al. |

OTHER PUBLICATIONS

PCT International Search Report and Written Opinion, PCT Application No. PCT/US13/74480, Jun. 5, 2014, 16 pages.

(Continued)

*Primary Examiner* — Kretelia Graham
(74) *Attorney, Agent, or Firm* — Fenwick & West LLP

(57) ABSTRACT

Embodiments relate to preventing or mitigating excessive drop in the negative voltage level of a bitline of memory bitcells by controlling the delay of a trigger signal for initiating injection of negative charge into the bitline. A write assist circuit causes negative charge to drop gradually in response to receiving a data input indicating a negative value of the bitline. When supply voltage is high, the timed delay of trigger signal is reduced, thereby causing negative charge to be injected into the bitline while bitline voltage remains at a higher voltage level and before the bitline voltage drops close to ground voltage. Since the negative charge is injected while the bitline voltage level is relatively high, the bitline is prevented from being pulled down to an excessively negative voltage level even when the supply voltage is relatively high.

20 Claims, 6 Drawing Sheets

(56) References Cited

OTHER PUBLICATIONS

Chang, J. et al., "A 20nm 112mb SRAM in High-κ Metal Gate with Assist Circuitry for Low-Leakage and Low-$V_{MIN}$ Applications," Advanced Embedded SRAM 18.1, Solid-State Circuits Conference Digest of Technical Papers (ISSCC), 2013 IEEE International, 2013, pp. 316-317 (3 pages total).

Chandra, V. et al., "On the Efficacy of Write-Assist Techniques in Low Voltage Nanoscale SRAMs," in Design, Automation Test in Europe Conference Exhibition (DATE), 2010, 2010, pp. 345-350.

Shibata, N. et al., "A 0.5-V 25-MHz 1-mW 256-Kb MTCMOS/SOI SRAM for Solar-Power-Operated Portable Personal Digital Equipment—Sure Write Operation by Using Step-Down Negatively Overdriven Bitline Scheme," IEEE Journal of Solid-State Circuits, Mar. 2006, pp. 728-742, vol. 41, No. 3.

Ananthan, H. et al., "FinFET SRAM—Device and Circuit Design Considerations," in Quality Electronic Design, 5th International Symposium on 2004 Proceedings, 2004, pp. 511-516.

Grossar, E. et al., "Read Stability and Write-Ability Analysis of sram Cells for Nanometer Technologies," IEEE Journal of Solid-State Circuits, 2006, pp. 2577-2588, vol. 41, No. 11.

Sinangil, M. et al., "A Reconfigurable 8t Ultra-Dynamic Voltage Scalable (U-DVS) SRAM in 65 nm CMOS," IEEE Journal of Solid-State Circuits, 2009, pp. 3163-3173, vol. 44, No. 11.

Yamaoka, M. et al., "Low-Power Embedded SRAM Modules with Expanded Margins for Writing," 2005 Digest of Technical Papers in Solid-State Circuits Conference, ISSCC, 2005 IEEE International, 2005, pp. 480-611 vol. 1.

Fujimura, Y. et al., "A Configurable SRAM with Constant-Negative-Level Write Buffer for Low-Voltage Operation with $0.149\mu m^2$ Cell in 32nm High-κ Metal-Gate CMOS," Solid-State Circuits Conference Digest of Technical Papers (ISSCC), 2010 IEEE International, 2010, pp. 348-349.

Goel, A. et al., "Process Variations Aware Area Efficient Negative Bit-Line Voltage Scheme for Improving Write Ability of SRAM in Nanometer Technologies," IET Circuits, Devices & Systems, 2012, pp. 45-51, vol. 6, No. 1.

\* cited by examiner

CONTROLLING TIMING OF NEGATIVE CHARGE INJECTION TO GENERATE RELIABLE NEGATIVE BITLINE VOLTAGE

CROSS-REFERENCE TO RELATED APPLICATION

This application claims the benefit of Indian Patent Application No. 5867/CHE/2013, filed on Dec. 16, 2013, which is incorporated by reference herein in its entirety.

BACKGROUND

1. Field of the Disclosure

The present disclosure relates to integrated memory devices and particularly to integrated memory devices having a data write assist scheme that prevents a bitline from being pulled down to an excessively negative voltage level.

2. Description of the Related Art

Integrated memory devices such as static random access memory devices (SRAMs) are subject to random variations due to Random Dopant Fluctuation (RDF), systematic and parametric variations when manufactured using subnanometer technologies. Due to such variations in the memory cell transistors, it is difficult to write data into the memory cells in cross corner locations due to such variations in the memory cell transistors. Such difficulty may affect SRAMs manufactured using technologies having a 20 nanometer feature size and less.

For SRAMs in nanometer technologies, write assist schemes may be used to enhance the signal-to-noise margin when writing data into a static memory bitcell. One way of providing the write assist is to use a negative bitline scheme that applies a negative potential to a bitline when a corresponding data value is supplied by the bitline to a static memory bitcell.

SUMMARY

Embodiments relate to a memory device using a trigger signal to set a time for injecting negative charge into a bitline to be pulled down to a negative voltage. The delay of the trigger signal is changed at a first rate in response to a change in a supply voltage level of the memory device. A plurality of memory bitcells are arranged in columns and rows with each column of the bitcells connected by a pair of the bitlines. A column decoder generates a column select signal indicating a column of the bitcells for a write operation. The delay of the column select signal changes at a second rate lower than the first rate in response to the change in the supply voltage level.

In one embodiment, the trigger signal generator operates in a non-saturated delay region.

In one embodiment, the column decoder operates in a saturated delay region.

In one embodiment, the trigger signal has a first delay at a first supply voltage and a second delay lower than the first delay at a second supply voltage higher than the first supply voltage.

In one embodiment, the trigger signal causes the write assist circuit operating at the first supply voltage to inject the negative charge into the bitline when the bitline is at a first voltage level. The trigger signal also causes the write assist circuit operating at the second supply voltage to inject the negative charge into the bitline when the bitline is at a second voltage level higher than the first voltage level.

In one embodiment, the write assist circuit includes a trigger gate having a first input and a second input. The first input receives the trigger signal and the second input receives data signal. The trigger gate generates an output signal that causes the output of a driver to disconnect from a signal line and inject the negative charge into the signal line based on the trigger signal and the data signal. The signal line is connected to a bitline via a column multiplexer.

In one embodiment, the memory device further includes a latch for enabling a clock signal used for generating the trigger signal and the column select signal.

In one embodiment, the memory device further includes a row decoder, a tracking circuit and a reset generation circuit. The row decoder generates a row select signal indicating a row of the bitcells for the write operation. The tracking circuit generates a tracking signal after a time interval corresponding to a time for performing a write operation on a bitcell. The reset generation circuit resets the clock signal based on the tracking signal.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments are related to preventing or mitigating excessive drop in the negative voltage level of a bitline of memory bitcells in a memory device by controlling the delay of a trigger signal for initiating injection of negative charge into the bitline. A write assist circuit causes drop the voltage level of the bitline in response to receiving a data input indicating a negative voltage level of the bitline. When the supply voltage level of the memory device is high (e.g., 5V), the delay of the trigger signal is reduced, thereby causing negative charge to be injected into the bitline while bitline voltage remains at a higher voltage level and before the bitline voltage drops to ground voltage. Since the negative charge is injected while the bitline voltage level is relatively high, the bitline is prevented from being pulled down to an excessively low negative voltage level even when the supply voltage is relatively high. Conversely, when the supply voltage level of the memory device is low (e.g., 2V), the delay of the trigger signal is increased, thereby causing negative charge to be injected into the bitline after the bitline voltage drops close to ground voltage. Hence, the bitline voltage is allowed to drop from a voltage level close to ground voltage when the supply voltage level of the memory device is low.

Generally, a write assist circuit for generating negative potential in bitlines tends to generate a lower negative voltage in the bitline as a supply voltage of the write assist circuit increases. The supply voltage may be increased due to conditions of the memory circuit or other circuits connected to the memory circuit. Alternatively, the difference in the supply voltage may be due to an intentional design choice. In such case, the same write assist circuit may be designed for use across multiple different supply voltage settings. In either case, when memory bitcells are exposed to excessively negative drop, the memory bitcells may be damaged or degraded in terms of their performance or the data in the cell can flip. Hence, it is advantageous to prevent excessive drop of negative bitline voltage even when the supply voltage level is increased.

Figure 1:
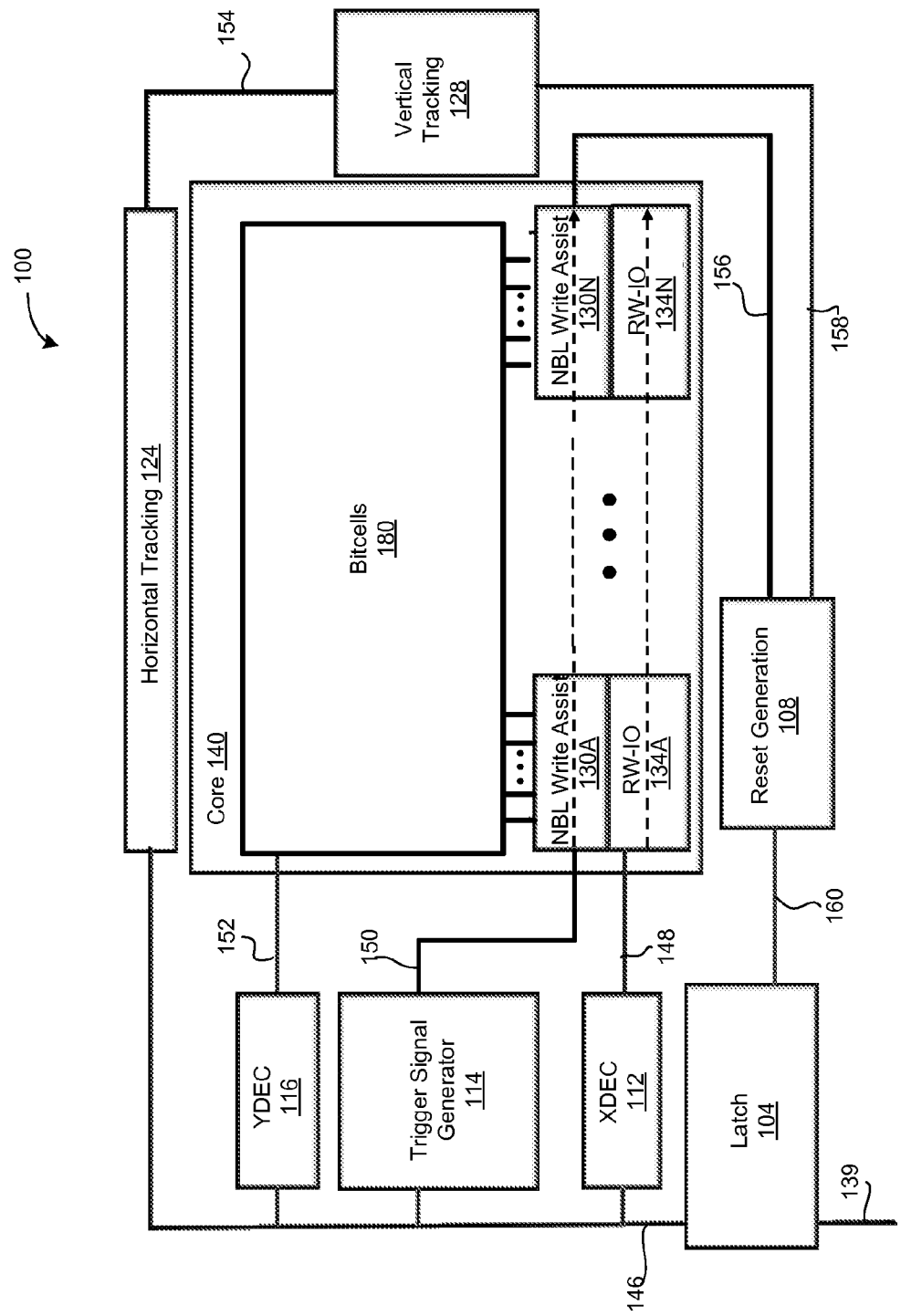
FIG. 1 is a diagram illustrating overall architecture a memory circuit, according to one embodiment.

FIG. 1 is a diagram illustrating overall architecture of a memory circuit 100, according to one embodiment. The memory circuit 100 may be embodied, for example, as static random-access memory (SRAM). The memory circuit 100 may include, among other components, a core circuit 140 and control circuits. The control circuit may include, among other components, a latch 104, a reset generation circuit 108, a column decoder XDEC 112, a trigger signal generator 114, a row decoder YDEC 116, a horizontal tracking circuit 124 and a vertical tracking circuit 128.

Core circuit 140 may include, among other components, bitcells 180, negative bitline (NBL) write assist circuits 130A through 130N (collectively referred to as "NBL write assist circuits 130") coupled to bitlines of the bitcells 180, and read-write input-output (RW-IO) 134A through 314N (collectively referred to as "RW-IOs 134"). Each of NBL write assist circuits 130 are connected to bitlines for a subset of bitcells 180 to write data to bitcells 180 by generating a negative bitline voltage at one bitline of a pair of complementary bitlines connected to a column of bitcells, as described below in detail with reference to FIG. 2. RW-IOs 134, in conjunction with NBL write assist circuits 130, write data to bitcells 180 and read data from bitcells 180.

Latch 104 produces clock signal 146 based on external clock signal 139. Latch 104 is reset by reset signal 160 aligned with times for bitcell read and write operations. Clock signal 146 is used for generating tracking signals 154, 156, 158 and reset signal 160, which are used for controlling timing of operations in components of the memory circuit 100. When external clock 139 is received at latch 104, latch 104 pulls the clock signal 146 into an active state, which in turn causes various signals such as trigger signal 150 and column select signal 148 to be generated. Tracking signal 158 turns active with a time interval that corresponds to a maximum time spent for performing a read or writing operation on bitcells with some margins. When tracking signal 158 is received at reset generation circuit 108, reset generation circuit 108 generates reset signal 160 that pulls clock signal 146 to an inactive state. By pulling clock signal 146 to the inactive state, signals 148, 150, 152 are also pulled to an inactive state, readying memory device 100 for the next operation cycle.

Column decoder XDEC 112 generates a column select signal 148 to select a column of bitcells for a read or write operation. As shown in FIG. 1, column select signal 148 may be transmitted from the left end RW-IO 134A to the right end RW-IO 134N via other RW-IO between the two RW-IOs. Due to the resistance and capacitance in a transmission line extending between these RW-IOs 134, lag time of the column select signal tends to increase as RW-IO is located further away from XDEC 112. The lag time of column select signal 148 is not significantly affected by supply voltage $V_{DD}$ of memory circuit 100 since column decoder XDEC 112 operates in a saturated delay region. The saturated delay region refers to an operating range of a circuit where the delay of a signal associated with the circuit remains relatively unchanged despite the change in the supply voltage.

Trigger signal generator 114 generates a trigger signal 150 sent to NBL write assist circuits 130. Trigger signal generator 114 may be embodied as a circuit for generating a trigger signal 114 that lags behind column select signal 148 by a timing difference that is dependent on supply voltage $V_{DD}$ of memory circuit 100. The amount of time that trigger signal 150 lags behind column select signal 148 depends on the voltage level of supply voltage $V_{DD}$. An example structure of trigger signal generator 114 is described below in detail with reference to FIG. 3.

Contrary to vertical tracking circuit 128, trigger signal generator 114 operates in a non-saturated delay region. The non-saturated delay region refers to an operating range of a circuit where the delay of a signal associated with the circuit changes significantly based on the change of the supply voltage. According, the delay of trigger signal 150 at a time changes based on the level of supply voltage. If supply voltage $V_{DD}$ is high, the delay of trigger signal 150 is relatively short. Conversely, if supply voltage $V_{DD}$ is low, the delay of trigger signal 150 is relatively long. By controlling the delay time of trigger signal 150, excessive drop of voltage in the bitlines to be placed in a negative voltage can be prevented, as described below in detail with reference to FIGS. 4A and 4B.

Row decoder YDEC 116 generates a row select signal 152 to select a row of bitcells 180 for read or write operations.

Horizontal tracking circuit 124 receives clock signal 146 and generates horizontal tracking signal 154 that is delayed by a predetermined amount of time corresponding to the amount of delay time that column select signal 148 is likely to undergo while traveling through RW-IOs 134.

Vertical tracking circuit 128 receives horizontal tracking signal 154 and generates a delay signal 158 that is delayed by an amount of time that corresponds to the time delay in the bitline signal caused by the resistance and capacitance in the bitline between NBL write assist circuit 130 and the selected row of bitcells. In other embodiments, a vertical tracking circuit can provide a vertical horizontal tracking signal based on which a horizontal tracking signal generates a delay signal. The horizontal tracking circuit 124 in conjunction with the vertical tracking circuit 128 functions to match the delays in the word-line and column select activation across all the rows of memory bitcells and bitline voltage change across all columns of the memory bitcells.

Reset generation circuit 108 receives delay signal 158 and a delayed version 156 of trigger signal 150. As trigger signal 150 travels through NBL write assist circuits 130 and transmission lines between NBL write assist circuits 130, the trigger signal 150 is gradually delayed. And hence, delayed trigger signal 156 lags behind trigger signal 150 by a certain amount of time. Reset generation circuit 108 generates reset signal 160 that resets latch 104.

Figure 2:
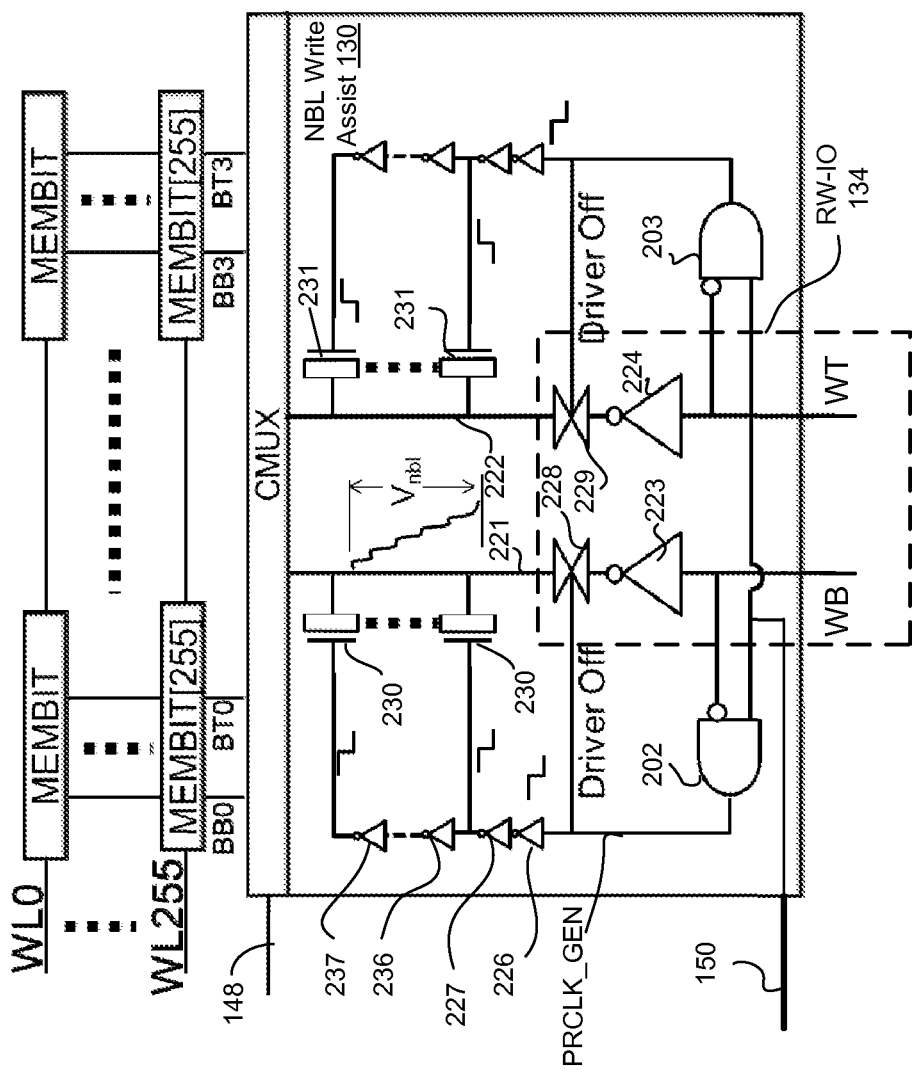
FIG. 2 is a diagram illustrating a write assist circuit of the memory circuit in more detail, according to one embodiment.

FIG. 2 is a diagram illustrating NBL write assist circuit 130 of the memory circuit 100 in more detail, according to one embodiment. During the write operation of one or more of the memory bitcells, NBL write assist circuit 130 provides voltage signals to one set of bitlines BB0, BT0 through BB3, BT3 selected by column select signal 148.

The values "0" and "1" received at the inputs WB, WT are complementary and only one of the inputs WB, WT have a voltage level corresponding to a logic value of "0" and the other of the inputs WB, WT has a voltage level corresponding to a logic value of "1". When the voltage at input WB turns high and input WT turns low, one of bitlines BB0 through BB3 may be pulled down to a negative potential to assist writing correct data values to a corresponding memory bitcell. When the voltage at input WT turns high and input WB turns low, one of bitlines BT0 through BT3 may be pulled down to a negative potential to assist writing correct data values to a corresponding memory bitcell.

NBL write assist circuit 130 may include, among other components, signal lines 221, 222, inverters 226, 227, 236, 237 connected in series, capacitors 230, 231, and a column multiplexer CMUX. NBL write assist circuit 130 is coupled to RW-IO 134. RW-IO 134 may include, among other components, drivers 223, 224 and pass gates 228, 229. Driver 223 receives the bit value of "0" or "1" from input WB and driver 224 receives a complementary bit value of "1" or "0" from input WT.

The signal lines 221, 222 may be precharged at the beginning of a write cycle. The signal lines 221, 222 are connectable to the bitlines BB0, BT0 through BB3, BT3 of the memory cell array through the column multiplexer CMUX according to column select signal 148. Specifically, a selected pair of bitlines BB0, BT0 through BB3, BT3 is coupled to signal lines 221, 222 by CMUX to initiate the bitline discharge for the write operation.

NBL write assist circuit 130 generates a negative voltage $-V_{nb1}$ relative to the ground potential $V_{SS}$ at signal line 221 when the voltage level at input WB turns high and trigger signal 150 turns high. In one embodiment, the multitude of capacitors 230 have one of their plates connected to the signal line 221 and the other plates connected to lines extending from nodes between pairs of inverters 226, 227, 236, 237. Other schemes may be used to pull down the voltage level of the signal line 221.

NBL write assist circuit 130 includes AND gates 202, 203. AND gate 202 receives trigger signal 150 and an inverted version of WB signal at its inputs. When trigger signal 150 is active and WB signal is inactive (i.e., corresponds to "0" value), PRCLK_GEN signal is generated. PRCLK_GEN signal is used to operate pairs of inverters 226, 227, 236, 237 to sequentially drop the voltage in signal line 230 by injecting negative charge by capacitors 130.

The driving signal PRCLK_GEN also functions as Driver Off signal that turns off pass gate 228, and thereby, decouples driver 223 from signal line 221. When PRCLK_GEN turns active, driver 223 is decoupled from signal line 221 by pass gate 228. By decoupling the line 221 from driver 223, the voltage level of line 221 can be gradually dropped to $-V_{nb1}$ below ground voltage $V_{SS}$ without being impacted by voltage regulating operation of driver 223.

Depending on the time at which PRCLK_GEN is generated relative to time at which signal WB is received at AND gate 202, the negative voltage bitline potential $-V_{nb1}$ can be adjusted across a wide range of supply voltage $V_{DD}$. Specifically, by adjusting the time at which trigger signal 150 arrives at AND gate 202, the negative voltage bitline potential $-V_{nb1}$ may remain above a predetermined level even if higher supply voltage $V_{DD}$ is applied to circuits, as described below in detail with reference to FIGS. 4A and 4B.

If PRCLK_GEN is generated shortly after data signal WB turns high, pass gate 228 decouples signal line 221 relatively early before the voltage level of signal line 221 drops to ground voltage $V_{SS}$ by the operation of driver 223. Consequently, signal line 221 is injected with negative charge by capacitors 230 while signal line 221 remains at a higher positive voltage level. Conversely, if PRCLK_GEN follows after a longer lag after data signal WB turns high, pass gate 228 decouples signal line 221 at a relatively late time, causing the voltage level of signal line 221 to reach a voltage level close to ground voltage $V_{SS}$ by the operation of driver 223. Hence, the negative charge by capacitors 230 is injected at the time when signal line 221 is at a lower voltage level. The results of such difference in the timing of negative charge injection are described below in detail with reference to FIGS. 4A and 4B.

Although the embodiment of FIG. 2 is described primarily with reference to the operations of left side of the NBM write assist circuit 130 and RW-IO 134 (including AND gate 202, driver 223, pass gate 228, inverters 226, 227, 236, 237, capacitors 230 and signal line 221), the same principle applies to the right side of the NBM write assist circuit 130 and RW-IO 134 (including AND gate 203, driver 224, pass gate 229, inverters, capacitors 231 and signal line 222), and hence, detailed description thereof is omitted herein for the sake of brevity.

NBL write assist circuit 130 is merely an example circuit that can be used to generate a negative bitline voltage. The negative voltage in the bitlines can also be generated by connecting the bitlines directly to a negative bias (e.g., an external source or a charge pump). The direct connection to the negative bias eliminates the needs for capacitors and charge injection through the capacitors. In other embodiments, the negative bitline capacitance is connected to the ground of drivers. When the bitline has fallen to a sufficient level, the ground is disconnected to trigger injection of the negative charge on the isolated ground of the driver, further dropping the voltage level of the bitline.

A propagation delay $t_d$ in a complementary metal-oxide-semiconductor (CMOS) circuit may be expressed by the following equation:

$$t_d = \frac{CV_{DD}}{(V_{DD} - V_t)^a} \qquad \text{equation (1)}$$

where C represents collective capacitance of the circuit, Vt represents a threshold voltage and a represents an empirical parameter used in alpha power law model (parameter a has a value between 1 and 2). An example graph illustrating the relationship between delay $t_d$ and supply voltage $V_{DD}$ is shown in FIG. 3A. As the capacitance C is increased, the graph representing the relationship shifts downward to the left. Taking the example where the capacitance is $C_2$, the supply voltage region can be divided at saturation voltage $V_{SAT2}$ into non-saturated delay region $R_{NS}$ and saturated delay region $R_S$. When the capacitance is lower (for example, $C=C_1$), the saturation voltage is higher (for example, $V_{SAT1}$).

When a circuit operates in a non-saturated delay region, a delay time of a signal associated with the circuit is changed significantly based on the level of supply voltage $V_{DD}$. Conversely, when a circuit operates in a saturated delay region, a delay time of a signal associated with the circuit remains relatively unchanged despite the change in the level of supply voltage $V_{DD}$.

Figure 3B:
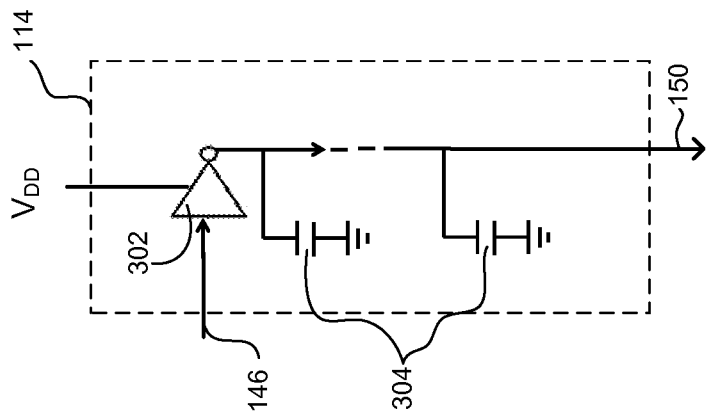
FIG. 3B is a circuit diagram of a trigger signal generator, according to one embodiment.
Figure 3A:
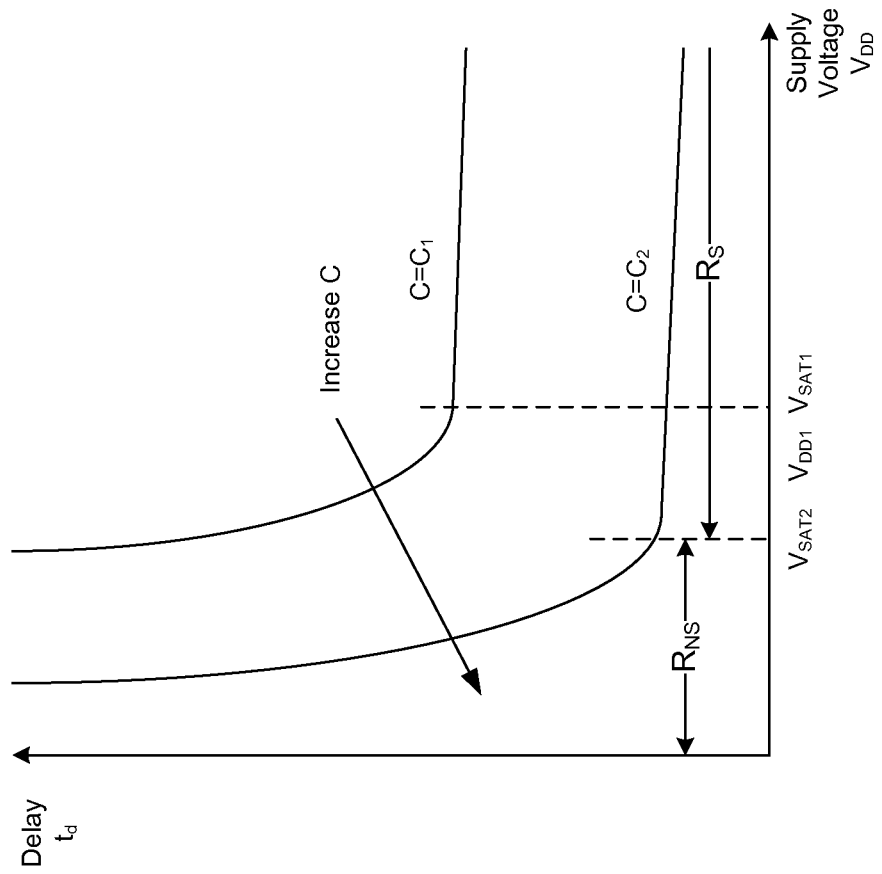
FIG. 3A is a graph illustrating relationship between a propagation delay and a supply voltage or the memory circuit, according to one embodiment.

FIG. 3B is a circuit diagram of trigger signal generator 114, according to one embodiment. Trigger signal generator 114 may include CMOS elements such as an inverter 302 and voltage dependent capacitors 304 (varcaps). The varcaps 304 are coupled in series between the output of inverter 302 and the output of trigger signal generator 114. The output of trigger signal generator 114 carries trigger signal 150. As set forth above with reference to FIG. 1, trigger signal generator 114 operates in the non-saturated delay region. Accordingly, delay time $t_d$ of trigger signal 150, as expressed by above equation (1), changes based on the voltage level of the supply voltage $V_{DD}$.

Specifically, the delay time $t_d$ of trigger signal 150 tends to decrease as the supply voltage $V_{DD}$ increases. Hence, when supply voltage $V_{DD}$ increases, trigger signal 150 propagates through trigger signal generator 114 at a faster speed. When supply voltage $V_{DD}$ decreases, trigger signal 150 propagates through trigger signal generator 114 at a slower speed. By appropriately setting the capacitance and threshold voltage Vt, the delay time of trigger signal 150 relative to inputs WB, WT can be controlled.

Figure 4B:
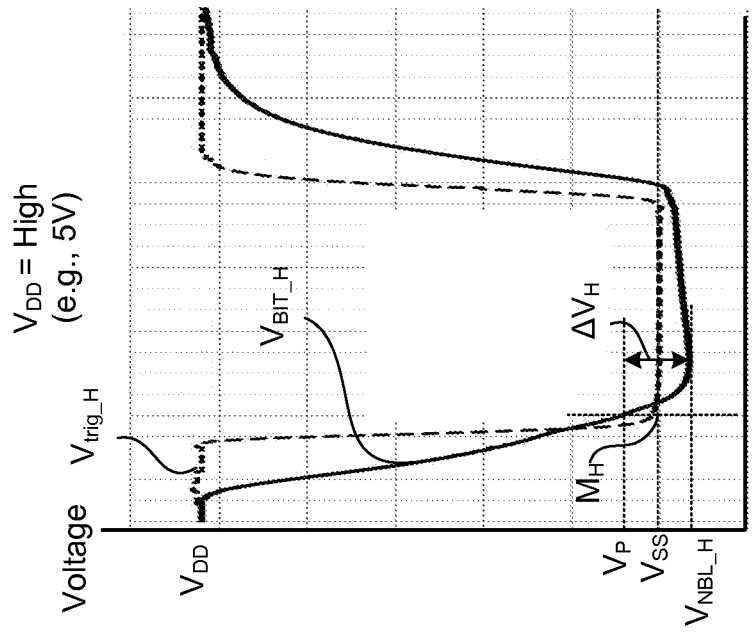
FIG. 4B is a timing diagram illustrating waveforms of a trigger signal and a bitline signal at a high supply voltage level, according to one embodiment.
Figure 4A:
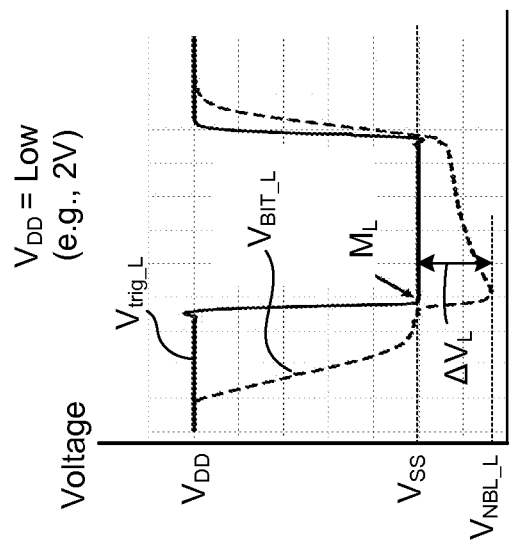
FIG. 4A is a timing diagram illustrating waveforms of a trigger signal and a bitline signal at a low supply voltage level, according to one embodiment.

FIG. 4A is a timing diagram illustrating waveforms of trigger signal $V_{trig\_L}$ and bitline voltage $V_{BIT\_L}$ at a low supply voltage level $V_{DD}$, according to one embodiment. Low supply voltage level $V_{DD}$ may be, for example, 2V.

At a relatively low voltage level, trigger signal 150 reaches NBL write assist circuit 130 relatively late, as described above in detail with reference to equation (1). Specifically, voltage level $V_{trig\_L}$ of trigger signal 150 reaches write assist circuit 130 when bitline voltage $V_{BIT\_L}$ of signal line 221 or 222 drops close to ground voltage $V_{SS}$ (as indicated by point $M_L$).

Since voltage $V_{trig\_L}$ drops to ground voltage $V_{SS}$ at a later time, PRCLK_GEN is also generated at a relatively late time. This causes negative charge injection by capacitors 230, 231 to occur after voltage $V_{BIT\_L}$ drops close to ground voltage $V_{SS}$. Hence, bitline voltage $V_{BIT\_L}$ can be pulled down by a voltage difference $\Delta V_L$ to negative voltage $V_{NBL\_L}$. Negative voltage $V_{NBL\_L}$ is relatively lower than ground voltage $V_{SS}$ despite the low supply voltage level of memory circuit 100.

FIG. 4B is a timing diagram illustrating waveforms of trigger signal $V_{trig\_H}$ and bitline voltage $V_{BIT\_H}$ at a high supply voltage level $V_{DD}$, according to one embodiment. High supply voltage level $V_{DD}$ may be, for example, 5V.

At a relative high voltage level, trigger signal 150 reaches NBL write assist circuit 130 relatively early, as described above in detail with reference to equation (1). Specifically, voltage level $V_{trig\_H}$ of trigger signal 150 reaches write assist circuit 130 before bitline voltage $V_{BIT\_H}$ of signal line 221 or 222 drops close to ground voltage $V_{SS}$ (as indicated by point $M_H$).

Since voltage $V_{trig\_H}$ drops to ground voltage $V_{SS}$ at a relatively early time, PRCLK_GEN is also generated at a relatively early time at point $M_H$. This causes negative charge injection by capacitors 230, 231 to occur when voltage $V_{BIT\_H}$ remains high at $V_P$. Hence, bitline voltage $V_{BIT\_H}$ is pulled down by a voltage difference $\Delta V_H$ from voltage $V_P$ to $V_{NBL\_H}$. $\Delta V_H$ and $\Delta V_L$ can be different and depends upon various factors such as the fabrication process of the circuit and operating temperatures. Since the voltage drop of $\Delta V_H$ starts from a positive voltage $V_P$, negative voltage $V_{NBL\_H}$ is not significantly lower compared to voltage $V_{NBL\_L}$ despite the higher supply voltage.

As can be seen from FIGS. 4A and 4B, by controlling the delay of trigger signal 150 to depend on the supply voltage, excessive drop in the negative voltage level of a bitline can be prevented. Therefore, the damage to bitlines can be prevented even when a spike of supply voltage occurs or the memory circuit is used with a high supply voltage.

Figure 5:
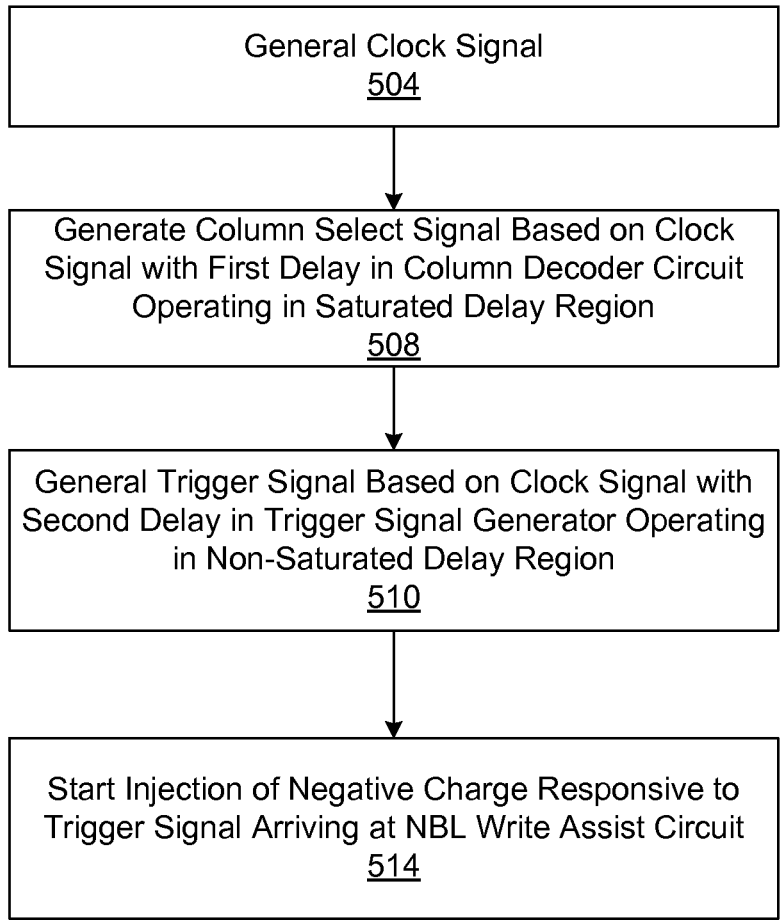
FIG. 5 is a flowchart illustrating a method of controlling the time for injecting negative charge into a bitline to place the bitline in a negative voltage level, according to one embodiment.

FIG. 5 is a flowchart illustrating a method of controlling injection of negative charge into a bitline, according to one embodiment. First, clock signal 146 is generated 504 by internal clock 104. Then, XDEC 112 generates 508 column select signal 148 with a first delay based on clock signal 146. The XDEC 112 operated in a saturated delay region, and therefore, the first delay remains relatively constant despite changes in the level of supply voltage $V_{DD}$.

Trigger signal generator 114 generates 510 trigger signal 150 with a second delay also based on clock signal 146. Trigger signal generator 114 operates in a non-saturated delay region, and therefore, the second delay is affected by the level of supply voltage. In one embodiment, the second delay is larger when the supply voltage is lower, and the second delay is smaller when the supply voltage is higher.

Injection of negative charge is started 514 when trigger signal 150 with the second delay arrives at NBL write assist circuit 130. In this way, the time at which the negative charge is injected by the NBL write assist circuit 130 is varied depending on the level of supply voltage. Consequently, the bitline voltage level at which the negative charge injection occurs varies depending on the supply voltage.

Figure 6:
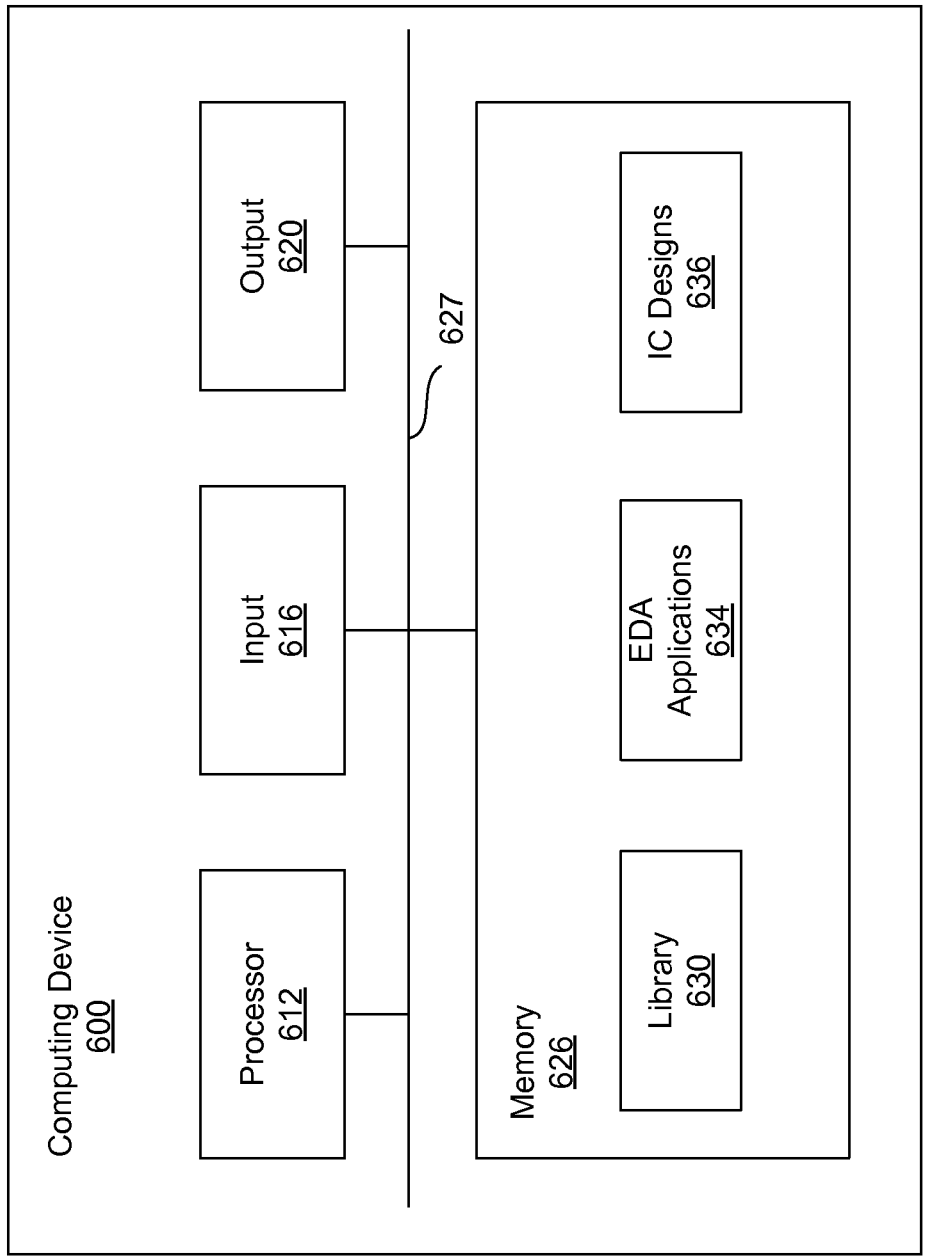
FIG. 6 is a block diagram of a computing device for designing a circuit, according to one embodiment.

FIG. 6 is a block diagram of a computing device 600 for performing designing operations associated with memory circuit 100. The computer device 600 may include, among other components, a processor 612, an input module 616, an output module 620, a memory 626 and a bus 627 for connecting these components. The processor 612 executes instructions stored in the memory 626. The input module 616 may include various devices for receiving user input, including keyboards and pointing devices (e.g., mouse and touch screen). The output module 620 includes a display device or interface device for communicating with the display device.

The memory 626 is a non-transitory computer readable storage medium storing, among others, library 630, electronic design automation (EDA) applications 634 and integrated circuit (IC) designs 636. The library 630 may include data on various circuit components, including instances of trigger signal generator 114 and/or write assist circuits 130 describe herein. The EDA applications 634 may include various software programs for designing ICs, including place and route tools, synthesis tools, and verification tools. The design processed by the EDA applications 634 may be stored in IC designs 936. The IC designs 636 may be an entire operational circuit or a part of a larger IC circuit.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A memory device, comprising:
a plurality of memory bitcells arranged in columns and rows, each column of the bitcells connected by a pair of bitlines;
a write assist circuit connected to at least one pair of the bitlines and configured to inject negative charge to a bitline of the pair of the bitlines to place the bitline in a negative voltage level in a write operation;
a column decoder configured to generate a column select signal indicating a column of the bitcells for the write operation, delay of the column select signal changing at a first rate responsive to change in a supply voltage level of the memory device; and
a trigger signal generator configured to generate a trigger signal to set time for injecting negative charge into the bitline to place the bitline in the negative voltage level, delay of the trigger signal changing at a second rate higher than the first rate responsive to change in the supply voltage level.

2. The memory device of claim 1, wherein the trigger signal generator operates in a non-saturated delay region.

3. The memory device of claim 2, wherein the column decoder operates in a saturated delay region.

4. The memory device of claim 1, wherein the trigger signal has a first delay at a first supply voltage and a second delay lower than the first delay at a second supply voltage higher than the first supply voltage.

5. The memory device of claim 4, wherein the trigger signal causes the write assist circuit operating at the first supply voltage to inject the negative charge into the bitline when the bitline is at a first voltage level, and the trigger signal causes the write assist circuit operating at the second supply voltage to inject the negative charge into the bitline when the bitline is at a second voltage level higher than the first voltage level.

6. The memory device of claim 1, wherein the write assist circuit comprises a trigger gate having a first input configured to receive the trigger signal and a second input configured to receive a data signal, the trigger gate generating an output signal causing disconnection of an output of a driver from a signal line and causing injection of the negative charge into the signal line based on the trigger signal and the data signal, the signal line connected to a bitline via a column multiplexer.

7. The memory device of claim 6, wherein the write assist circuit further comprises at least one capacitor configured to inject the negative charge into the signal line based on the output signal of the trigger gate.

8. The memory device of claim 1, further comprising a latch configured to enable a clock signal to generate the trigger signal and the column select signal.

9. The memory device of claim 8, further comprising:
a row decoder configured to generate a row select signal indicating a row of the bitcells for the write operation;
a tracking circuit configured to generate a tracking signal after a time interval corresponding to a time for performing a write operation on a bitcell; and
a reset generation circuit configured to reset the clock signal based on the tracking signal.

10. A non-transitory computer readable storage medium storing a digital representation of a memory device comprising:
a plurality of memory bitcells arranged in columns and rows, each column of the bitcells connected by a pair of bitlines;
a write assist circuit connected to at least one pair of the bitlines and configured to inject negative charge to a bitline of the pair of the bitlines to place the bitline in a negative voltage level in a write operation;
a column decoder configured to generate a column select signal indicating a column of the bitcells for the write operation, delay of the column select signal changing at a first rate responsive to change in a supply voltage level of the memory device; and
a trigger signal generator configured to generate a trigger signal to set time for injecting negative charge into the bitline to place the bitline in the negative voltage level, delay of the trigger signal changing at a second rate higher than the first rate responsive to change in the supply voltage level.

11. The computer readable storage medium of claim 10, wherein the trigger signal generator operates in a non-saturated delay region.

12. The computer readable storage medium of claim 11, wherein the column decoder operates in a saturated delay region.

13. The computer readable storage medium of claim 10, wherein the trigger signal has a first delay at a first supply voltage and a second delay lower than the first delay at a second supply voltage higher than the first supply voltage.

14. The computer readable storage medium of claim 13, wherein the trigger signal causes the write assist circuit operating at the first supply voltage to inject the negative charge into the bitline when the bitline is at a first voltage level, and the trigger signal causes the write assist circuit operating at the second supply voltage to inject the negative charge into the bitline when the bitline is at a second voltage level higher than the first voltage level.

15. The computer readable storage medium of claim 10, wherein the write assist circuit comprises a trigger gate having a first input configured to receive the trigger signal and a second input configured to receive a data signal, the trigger gate generating an output signal causing disconnection of an output of a driver from a signal line and causing injection of the negative charge into the signal line based on the trigger signal and the data signal, the signal line connected to a bitline via a column multiplexer.

16. The computer readable storage medium claim 15, wherein the write assist circuit further comprises at least one capacitor configured to inject the negative charge into the signal line based on the output signal of the trigger gate.

17. The computer readable storage medium claim 10, further comprising a latch configured to enable a clock signal to generate the trigger signal and the column select signal.

18. The computer readable storage medium claim 17, wherein the memory device further comprises:
a row decoder configured to generate a row select signal indicating a row of the bitcells for the write operation;
a tracking circuit configured to generate a tracking signal after a time interval corresponding to a time for performing a write operation on a bitcell; and
a reset generation circuit configured to reset the clock signal based on the tracking signal.

19. A method of generating negative bitline voltage for memory bitcells, comprising:
generating a column select signal with a first delay based on a clock signal, the column select signal indicating a column of the memory bitcells for a write operation, the first delay changing at a first rate responsive to change in a supply voltage level of the memory device;
generating a trigger signal with a second delay based on the clock signal, the trigger signal separate from the column select signal and configured to set time for injecting negative charge into a bitline of a pair of bitlines connected to the memory bitcells for the write operation, the first second changing at a second rate higher than the first rate responsive to change in a supply voltage level of the memory device; and injecting negative charge to the bitline responsive to receiving the trigger signal.

20. The method of claim 19, wherein the trigger signal has a first delay at a first supply voltage and a second delay lower than the first delay at a second supply voltage higher than the first supply voltage.

* * * * *